United States Patent [19]
Bauer et al.

[11] Patent Number: 6,046,117
[45] Date of Patent: Apr. 4, 2000

[54] PROCESS FOR ETCHING SEMICONDUCTOR WAFERS

[75] Inventors: Theresia Bauer, Burgkirchen; Susanne Weizbauer, Rosenheim; Hanns Wochner, Burghausen; Alfred Bergler, Neuötting, all of Germany

[73] Assignee: Wacker Siltronic Gesellschaft Für Halbleitermaterialien AG, Burghausen, Germany

[21] Appl. No.: 09/082,865

[22] Filed: May 21, 1998

[30] Foreign Application Priority Data

May 22, 1997 [DE] Germany ............... 197 21 493

[51] Int. Cl.[7] .................................................. H01L 21/306
[52] U.S. Cl. ........................ 438/745; 438/753; 438/974; 252/79.3
[58] Field of Search .................... 438/745, 747, 438/753, 757, 974; 252/79.3, 79.2

[56] References Cited

U.S. PATENT DOCUMENTS

| 3,966,517 | 6/1976 | Claes et al. | 438/752 |
| 4,540,465 | 9/1985 | Coggins et al. | 216/93 |
| 5,340,437 | 8/1994 | Erk et al. | 438/747 |

FOREIGN PATENT DOCUMENTS

| 0791953 | 8/1997 | European Pat. Off. . |
| 52-71180 | 6/1977 | Japan . |

OTHER PUBLICATIONS

"Chemical Etching of Silicone", Journal of the Electrochemical Society, vol. 123, No. 12, Dec. 1976, pp. 1903–1909.

"Chemical Etching of Germanium in Solutions of HF, $HNO_3$, $H_2O$ and $HC_2H_3O_2$," Journal of the Electrochemical Society, vol. 111, No. 2, Feb. 1964, pp. 196–201.

Patent Abstracts of Japan, vol. 1, No. 135 (E–001), Nov. 9, 1977 & JP 52071180A (Mitsubishi Electric).

*Primary Examiner*—Benjamin L. Utech
*Assistant Examiner*—Donald L. Champagne
*Attorney, Agent, or Firm*—Collard & Roe, P.C.

[57] ABSTRACT

A process is taught for etching semiconductor wafers with an etching mixture comprising nitric and hydrofluoric acids and optionally a surfactant. To this mixture are added either more hydrofluoric acid, or more hydrofluoric and nitric acids, with the added acids having concentrations of at least 70% by weight. The use of concentrated acids reduces the loss of substrate material and extends etching bath life.

5 Claims, No Drawings

PROCESS FOR ETCHING SEMICONDUCTOR WAFERS

BACKGROUND OF THE INVENTION

1. Field of the Invention

The present invention relates to a process for etching semiconductor wafers by exposure to an etching mixture which is obtained by mixing nitric acid and hydrofluoric acid and optionally a surfactant.

2. The Prior Art

Semiconductor wafers, such as, silicon semiconductor wafers, as a base material for electronic components are obtained from a rod-shaped single crystal via a sequence of machining steps. First, the single crystal is cut into wafers. The near-surface crystal regions of the resultant semiconductor wafers are damaged to a depth of approximately 80 $\mu$m by the wire or annular saws. This so-called "damage" is reduced, as a rule, by a mechanical surface treatment, for example by lapping or grinding the wafers. Wet-chemical removal of further silicon layers then results in almost complete removal of the damage. It also results in the deliberate production of defined surface parameters, such as microroughness and reflectivity. The object of etching is to obtain a wafer surface which is as plane-parallel and as defect-free as possible and which has a low microroughness and high reflectivity. If the etching process is performed in an acidic medium, nitric acid is frequently used as oxidizing agent and hydrofluoric acid is used as a dissolving agent, optionally in conjunction with a surfactant. An example of this type of etching process is described, in U.S. Pat. No. 5,451,267.

If these acids are used, the disposal of them as waste must be environmentally compatible. This waste disposal therefore generates substantial costs.

SUMMARY OF THE INVENTION

It is an object of the present invention to reduce the acid consumption without simultaneously impairing the etching result.

This object is achieved according to the invention by a process for etching semiconductor wafers with an etching mixture which is obtained by mixing nitric acid and hydrofluoric acid and optionally a surfactant, and then adding to this mixture either further hydrofluoric acid or further hydrofluoric acid and nitric acid. The added nitric acid has a concentration of $\geq$70% by weight and the added hydrofluoric acid has a concentration of >50% by weight. Alternatively, the nitric acid has a concentration of >70% by weight and the hydrofluoric acid has a concentration of $\geq$50% by weight. These ingredients are used to prepare the etching mixture.

By using an etching mixture which contains at least one of the acids used in a more concentrated form than was previously used, it is possible to extend appreciably the life of the etching bath. This means that substantially more semiconductor wafers can be etched before the etching mixture has to be replaced and disposed of as waste. This economizes on acids and the costs associated with the etching decrease although the expenditure on safety increases as a function of the increasing acid concentration.

The term bath life is to be understood as meaning the time interval during which the etching mixture can be used to etch semiconductor wafers. This is the case for as long as the microroughness and the reflectivity of the etched semiconductor wafers are in a desired tolerance range. This is also the case wherein the contamination of the etching mixture with metals, particles and hexafluorosilicic acid does not exceed a predetermined value.

A lengthening of the bath life is possible, in particular, if nitric acid having a concentration of 73% to 98% by weight and hydrofluoric acid having a concentration of >60% to 95% by weight are used to prepare the etching mixture.

In addition, it has been found that the values for microroughness and reflectivity in the case of the etched semiconductor wafers depends on the concentration of the nitric acid used to prepare the etching mixture. These values are all the more favorable, when more concentrated nitric acid is used. Nevertheless, even if an etching mixture is used which contains nitric acid which is of relatively low concentration within the scope of the range specified above, semiconductor wafers having adequate roughness values and brightness values are obtained. The use of nitric acid which is as concentrated as possible to prepare the etching mixture can therefore also be used to reduce the material removed per semiconductor wafer. This removal of material is done without the values for microroughness and reflectivity of the semiconductor wafers being thereby impaired when compared with the prior art values. In total, an appreciable saving of semiconductor material is consequently possible.

Particularly preferred is the use of an etching mixture which is obtained by mixing nitric acid having a concentration of 80% by weight and hydrofluoric acid having a concentration of 70% by weight. Using this etching mixture, semiconductor wafers can be obtained by the invention whose microroughness values and reflectivity values are equal to prior art wafers in which the amount of material removal is one third higher. Similarly good results are obtained in relation to the lengthening of the bath life, but are not obtained in relation to saving silicon, by using an etching mixture comprised by mixing nitric acid having a concentration of 70% by weight and hydrofluoric acid having a concentration of 85% by weight.

To improve the etching further, in another embodiment, it is proposed to add either further hydrofluoric acid or to add further nitric acid and hydrofluoric acid to the etching mixture. The further acid etchant added preferably has the same concentration as the corresponding acid which was originally used to prepare the initial etching mixture.

The nitric acid and hydrofluoric acid used in the etching mixture may be diluted by this further addition and by water formed during the etching. It is therefore particularly preferable to counteract this dilution effect in that further hydrofluoric acid or further hydrofluoric acid and nitric acid are added. Also the further acid etchant added is 5% to 10% more concentrated than the corresponding acid which was previously used to prepare the initial etching mixture. The concentrations of the acids for the etching mixture must, of course, be chosen in this case so that it is still possible to add further more highly concentrated acids. Surprisingly, this measure not only lengthens the bath life, but also has a positive effect on the values for microroughness and reflectivity of the etched semiconductor wafers. The range of variation in these values becomes narrower and also qualitatively better. These improved results can be increased still further by replacing a certain volume of the etching mixture in addition to further acid addition.

For a given surface state of the silicon wafers, values for the reflectivity are obtained with the procedure according to the invention which are between 28% and 40% depending upon the acid concentration. Values of between 0.15 $\mu$m and 0.13 $\mu$m are measured for the microroughness Ra. In the case of etching processes in accordance with the prior art, on the other hand, the semiconductor wafers have reflectivity values of only 15% to 20% and microroughnesses of 0.17 μm to 0.25 μm with the same etching removal at lower acid concentrations.

DETAILED DESCRIPTION OF PREFERRED EMBODIMENTS

Other objects and features of the present invention will become apparent from the following detailed description considered in connection with the accompanying examples. It should be understood, however, that this is designed for the purpose of illustration only and not as a definition of the limits of the invention.

Two comparison examples in which silicon wafers were treated with an etching mixture in accordance with the prior art are contrasted below with an example of the treatment, according to the invention, of semiconductor wafers.

The reflectivity of the etched surfaces was determined with a reflectometer. A polished silicon wafer having a reflectivity of 100% served as reference. The microroughness Ra was measured using a perthometer (0.8 μm filter, 4.8 μm measurement path). The measurements were made at each of three points over the isohypse of the wafer, the measured value being the mean value from five wafers.

Five semiconductor wafers were subjected in each case to three different etching processes. In these processes, the material removed by etching, the concentration of the nitric acid and the hydrofluoric acid were varied; the amount of surfactant added and also all the other processing parameters (temperature, time etc.) were kept constant. The results are summarized in Table 1.

The measured values show that an increase in the reflectivity and a reduction in the microroughness can be achieved either by increasing the material removed by etching (compare Comparison Example 1 with Comparison Example 2) or, according to the invention, by using more highly concentrated acids or a more highly concentrated acid mixture (compare Comparison Example 2 with Example 3).

TABLE 1

Reflectivity and Microroughness on Varying the Etching Process

| | Comparison Example 1 | Comparison Example 2 | Example 3 |
|---|---|---|---|
| Concentration of $HNO_3$ for preparing the etching mixture [% by wt] | 70 | 70 | 80 |
| Concentration of HF for preparing the etching mixture [% by wt] | 50 | 50 | 70 |
| Material removed by etching z [μm] | 30 | 20 | 20 |
| Reflectivity [%] | 38 | 18 | 37 |
| Microroughness Ra [μm] | 0.14 | 0.16 | 0.14 |

As a result of using the highly concentrated etching mixtures, the bath life can be appreciably lengthened while surface quality remains consistently high. This is due to the lower amount of material removed by etching which is now possible and because less water is introduced. Depending on how high the chosen concentrations are, the bath life can be lengthened by a factor of 2 to 3 and the amount of silicon removed can be reduced by a third. This results in a large potential saving of ultrapure silicon and in a marked reduction in the environmental pollution as a result of the lower acid consumption.

Table 2 shows eight examples (E1 to E8) of the treatment, according to the invention, of semiconductor wafers with different acid concentrations. An etching process in accordance with the prior art, in which nitric acid having a concentration of 70% by weight and hydrofluoric acid having a concentration of 50% by weight were mixed to prepare an etching mixture, namely comparison example (C).

The further addition was carried out in accordance with the stoichiometric consumption of acids and the amount lost when lifting the semiconductor wafers out of the etching bath.

TABLE 2

Lengthening of the Bath Life on Using Highly Concentrated Acids

| | $HNO_3$ conc.* [% by wt] | HF conc.* [% by wt] | Conc. of further $HNO_3$* added [% by wt] | Conc. of further HF* added [% by wt] | Bath life lengthening factor |
|---|---|---|---|---|---|
| C | 70 | 50 | 70 | 50 | 1 |
| E1 | 70 | 70 | 70 | 70 | 1.6 |
| E2 | 70 | 85 | 70 | 85 | 2 |
| E3 | 70 | 100 | 70 | 100 | 2.5 |
| E4 | 75 | 70 | 75 | 70 | 2.4 |
| E5 | 85 | 50 | 85 | 50 | 2.4 |
| E6 | 85 | 60 | 85 | 60 | 2.8 |
| E7 | 85 | 70 | 85 | 70 | 3.9 |
| E8 | 80 | 70 | 80 | 70 | 3.1 |

*as individual component

With the process in accordance with the prior art, this result can be achieved only by means of increasing the material removed by etching. However, this should be avoided because of the loss therewith of ultrapure silicon, and because of the increased acid consumption. Comparison of the measured values of Comparison Example 2 with Example 3 shows a clear improvement in the reflectivity and microroughness in the case of the treatment, according to the invention of the silicon wafers.

As can be seen clear from Table 1 and Table 2, lengthened bath lives and improved surface properties accompanied by a simultaneously low amount of material removed by etching can be achieved by the process according to the invention.

While several embodiments of the present invention have been shown and described, it is to be understood that many changes and modifications may be made thereunto without departing from the spirit and scope of the invention as defined in the appended claims.

What is claimed is:

1. A process for etching semiconductor wafers with an etching mixture comprising preparing the etching mixture by mixing nitric acid and hydrofluoric acid and optionally a surfactant and adding to said etching mixture additional etchant selected from the group consisting of hydrofluoric acid and an acid mixture of hydrofluoric acid and nitric acid, wherein said acid mixture is selected from the group consisting of (1) nitric acid having a concentration of $\geq 70\%$ by weight and hydrofluoric acid having a concentration of $>70\%$ by weight, and (2) nitric acid having a concentration of $>70\%$ by weight and hydrofluoric acid having a concentration of $\geq 70\%$ by weight; and immersing said semiconductor wafers in said etching mixture.

2. The process as claimed in claim 1, comprising preparing the etching mixture by mixing nitric acid having a concentration of 73% to 98% by weight and hydrofluoric acid having a concentration of >70% to 95% by weight.

3. The process as claimed in claim 1, wherein said additional etchant added has the same concentration as the corresponding acid which was used to prepare the etching mixture.

4. The process as claimed in claim 1, wherein said additional etchant added is 5% to 10% more concentrated than the corresponding acid which was used to prepare the etching mixture.

5. The process as claimed in claim 1, wherein a volume of the etching mixture is replaced with additional etchant.

* * * * *